United States Patent
Philippot et al.

(10) Patent No.: US 6,518,768 B1
(45) Date of Patent: Feb. 11, 2003

(54) ARRANGEMENT, METHOD, AND CURRENT MEASUREMENT DEVICE FOR MEASURING A CURRENT IN A CONDUCTOR

(75) Inventors: Luc Philippot, Berlin (DE); Norbert Schuster, Ebermannstadt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/673,409

(22) PCT Filed: Apr. 16, 1999

(86) PCT No.: PCT/DE99/01212

§ 371 (c)(1),
(2), (4) Date: Mar. 29, 2001

(87) PCT Pub. No.: WO99/54742

PCT Pub. Date: Oct. 28, 1999

(30) Foreign Application Priority Data

Apr. 17, 1998 (DE) .......................... 198 17 940

(51) Int. Cl.⁷ ............................................. G01R 31/08
(52) U.S. Cl. ...................................... 324/522; 324/524
(58) Field of Search ........................... 361/82; 324/522, 324/524, 519

(56) References Cited

U.S. PATENT DOCUMENTS

| | | | | |
|---|---|---|---|---|
| 4,352,137 A | * | 9/1982 | Johns | 324/519 |
| 4,862,308 A | | 8/1989 | Udren | 361/45 |
| 5,561,605 A | * | 10/1996 | Zuercher | 324/522 |

FOREIGN PATENT DOCUMENTS

| | | |
|---|---|---|
| DE | 692 19 055 | 10/1997 |
| DE | 196 30 989 | 2/1998 |
| DE | 196 40 821 | 4/1998 |

* cited by examiner

Primary Examiner—Christine K. Oda
(74) Attorney, Agent, or Firm—Kenyon & Kenyon

(57) ABSTRACT

A method, an arrangement, and a current measurement device with which a signal that characterizes a fault current in an electrical conductor having at least three conductor ends can be produced in a particularly simple fashion. In particular, a current measurement device is provided for measuring a current in a conductor. The current measurement device includes at least one measurement value input and at least one measurement value output, and has an arithmetic unit that adds a current measurement value corresponding to the current to a measurement value present at the at least one measurement value input. A resulting summation current measurement value is output at the at least one measurement value output.

9 Claims, 2 Drawing Sheets

ARRANGEMENT, METHOD, AND CURRENT MEASUREMENT DEVICE FOR MEASURING A CURRENT IN A CONDUCTOR

FIELD OF THE INVENTION

The present invention relates to an arrangement, method and device for measuring a current in a conductor.

SUMMARY

An object of the present invention is to provide a method that is particularly simple to execute for producing a signal that characterizes a fault current in an electrical conductor that has at least three conductor ends. In this context, a fault current is understood to be a current that flows out of the conductor, or that flows into the conductor, at a fault point of the conductor, for example a short-circuit point, and thus not at one of the conductor ends.

In order to achieve this object, according to the present invention, a method is provided for producing a fault signal that characterizes a fault current of an electrical conductor that has at least three conductor ends, using current measurement devices that are arranged in such a way that one of the current measurement devices is attached at each conductor end of the conductor and the current measurement devices are connected via data lines. The method the current in the respective conductor ends is measured using the current measurement devices, and current measurement values are formed. A measurement value, formed from the current measurement values of the other current measurement devices using addition that respects the sign, is transmitted to a selected current measurement device, using the selected current measurement device, an overall current value is formed from the current measurement values thereof and the measurement value, using addition that respects the sign, and the fault signal, is produced using the selected current measurement device if the absolute value of the overall current value exceeds a predetermined threshold value. The sign-respecting addition of the current measurement values can take place in the time domain or in the frequency domain. If the method according to the present invention is used in a three-phase alternating current system, the method is executed separately for each phase, i.e. for each phase conductor; in this context, each phase can be switched off individually in the case of a fault current.

An advantage of the method according to the present invention is that it is very fast, because in the method, the current measurement values of the other current measurement devices are first combined, by sign-respecting addition, to form one measurement value, and subsequently only this measurement value is transmitted to the selected current measurement device. Since only this single measurement value need be transmitted to the selected current measurement device, the overall quantity of data to be transmitted is very small; this results in the particularly high speed of the method according to the present invention, since the smaller the amount of data to be transmitted, the less is time required for this. In addition, only a single computational step need be executed in the selected current measurement device, consisting in the addition of the transmitted measurement value to the measured current measurement value of the selected current measurement device; the transmission of the previously determined measurement value therefore relieves the selected current measurement device of further computational steps, likewise resulting in an increase in speed.

The object is also achieved by a method according to the present invention for producing a fault signal that characterizes a fault current of an electrical conductor having at least three conductor ends, using current measurement devices arranged in such a way that one of the current measurement devices is attached to each conductor end of the conductor and the current measurement devices are connected via data lines. In the method the current in the respective conductor ends is measured using the current measurement devices, with formation of current measurement values, and a measurement value, formed from the current measurement values of a first group of the remaining current measurement devices by sign-respecting addition, is transmitted to a selected current measurement device, and an additional measurement value, formed from the current measurement values of a second group of the remaining current measurement devices by sign-respecting addition, is transmitted to the selected current measurement device. The second group contains all current measurement devices except for the selected ones and the current measurement devices of the first group. Using the selected current measurement device, an overall current value is formed from the current measurement values thereof and the two measurement values through sign-respecting addition, and the fault signal is produced using the selected current measurement device if the absolute value of the overall current value exceeds a predetermined threshold value. The advantages cited in connection with the first method also hold for the second method according to the present invention. A particular advantage of the second method, is that in this method the current measurement devices can be divided into two groups and a separate measurement value can be formed for each of the two groups. This can, for example, be advantageous if the two groups of current measurement devices are separated from one another by a large spatial distance and the formation and transmission of a single measurement value to the selected current measurement device would cause a particularly high expense.

Moreover, an arrangement according to the present invention is provided with which a fault signal characterizing a fault current in an electrical conductor having at least three conductor ends can be formed in a particularly simple fashion.

This object is achieved by an arrangement for producing a fault signal that characterizes a fault current of an electrical conductor having at least three conductor ends. A current measurement device, attached to each conductor end of the conductor, measures the current in its respective conductor end with formation of a current measurement value. The current measurement devices in the arrangement are connected to one another electrically by means of data lines in a chain-type structure in such a way that each internal current measurement device in the chain is connected, with a measurement value input, to a measurement value output of the current measurement device arranged upstream therefrom, and is connected, with a measurement value output, to a measurement value input of the current measurement device arranged downstream therefrom. A first current measurement device of the two current measurement devices arranged externally in the chain is connected, with its measurement value output, to a measurement value input of the internal current measurement device arranged downstream therefrom. The second of the two external current measurement devices is connected, with a measurement value input, to the measurement value output of the internal current measurement device arranged upstream therefrom. Each internal current measurement device has an arithmetic unit that adds, in sign-respecting fashion, its current measurement value to a measurement value, present at its measurement value input, of the respective upstream current measurement device, so as to form a summation current measurement value, and outputs the summation current measurement value as a measurement value at its measurement value output. The second external current measurement device has a control unit that outputs the fault signal as soon as an overall current value, formed by sign-respecting addition from the measurement value of the upstream internal current measurement device and its current measurement value, exceeds a predetermined threshold value. An advantage of this arrangement is the particularly high speed with which the fault signal is produced, since not all the current measurement values of the other current measurement devices are transmitted individually to the second external current measurement device. Instead, only a single measurement value is transmitted that contains the current sums of the remaining current measurement devices. This results in a particularly rapid production of the fault signal, because the overall quantity of data to be transmitted to the second external current measurement device is relatively small, since only a single measurement value is to be transmitted. An additional advantage of the arrangement according to the present invention is that only relatively few data lines are necessary for connecting the current measurement devices; given a line having N conductor ends, in the chain-type arrangement of the current measurement devices only (N−1) data lines are required, whereas, in contrast, given an arrangement in which all current measurement devices are connected to one another N*(N−1) data lines are required.

In order that, in addition to the second external current measurement device, at least one internal current measurement device can also produce the fault signal, within the scope of a development of the arrangement, the internal current measurement devices may be connected to one another in such a way that an additional measurement value input of an internal current measurement device is connected to an additional measurement value output of the internal current measurement device arranged downstream therefrom, and an additional measurement value output of an internal current measurement device is connected to an additional measurement value input of the internal current measurement device arranged upstream therefrom. The first external current measurement device is connected, with a measurement value input, to an additional measurement value output of the internal current measurement device arranged downstream therefrom. The second external current measurement device is connected, with a measurement value output, to an additional measurement value input of the internal current measurement device arranged upstream therefrom. Each internal current measurement device has an additional arithmetic unit that adds, in sign-respecting fashion, the current measurement value of its own current measurement device to an additional measurement value, present at its additional measurement value input, of the downstream current measurement device, so as to form an additional summation current measurement value, and outputs the resulting additional summation current measurement value at its additional measurement value output as an additional measurement value. At least one of the internal current measurement devices has a control unit that produces the fault signal as soon as the overall current value, formed by sign-respecting addition from the measurement values present at its two measurement value inputs and its measured current measurement value, exceeds the predetermined threshold value. The advantage of this arrangement is that a plurality of current measurement devices of the arrangement are able to produce the fault signal, since all the current measurement devices are provided with the required items of current information; in such an arrangement, 2*(N−1) data lines are then required.

In order that the fault signal can also be produced using the first external current measurement device, the first external current measurement device may have a control unit that produces the fault signal as soon as the overall current value—formed by sign-respecting addition from the measurement value present at its measurement value input and its measured current measurement value—exceeds the predetermined threshold value.

A particularly high degree of reliability can be achieved in the arrangement according to the present invention if the two external current measurement devices are connected with one another by at least one additional data line via which the overall current value is transmitted. This is because in such an arrangement the respectively determined overall current value can be transmitted between the two external current measurement devices for monitoring purposes; for example, the two external current measurement devices can check the readiness for operation of the overall arrangement by comparing their respective overall current values. An additional advantage of the additional data line is that the arrangement according to the present invention can continue to be operated even if one of the data lines is interrupted by a disturbance.

Within the scope of the present invention, a current measurement device is also proposed that can be used in the method or in the arrangement according to the present invention. This is a current measurement device for measuring a current in a conductor having at least one measurement value input and at least one measurement value output, as well as an arithmetic unit that adds a current measurement value corresponding to the current to a current measurement value present at the at least one measurement value input, and outputs the resulting summation current measurement value at the at least one measurement value output. The advantage of the current measurement device according to the present invention is that it has an arithmetic unit with which, for example, summation current measurement values can be formed, as was explained above in connection with the method or the arrangement according to the present invention. The advantages described above in connection with the method and with the arrangement thus hold in corresponding fashion for the current measurement device according to the present invention.

In order to facilitate the installation of the current measurement device according to the present invention, it is proposed, within the scope of a development of the current measurement device, that the arithmetic unit have a device with which the sign of the current measurement value can be changed. Such a current measurement device has the advantage that when connecting the current measurement device to a conductor or to a conductor end no attention need be paid to the direction of the current in the conductor or conductor end, because the sign of the current measurement value determined by the current measurement device can be changed if necessary, so to speak retroactively. This may be for example, important with respect to the sign-respecting addition of the current measurement values in the inventive method for producing a fault signal, since in the formation of a summation current measurement value the signs are of course to be taken into account.

If in addition a fault signal is also to be formed using the inventive current measurement device, may be as advantageous if the current measurement device has a control unit that outputs a signal for a fault current as soon as the summation current measurement value exceeds a predetermined threshold value.

DETAILED DESCRIPTION

Figure 1:
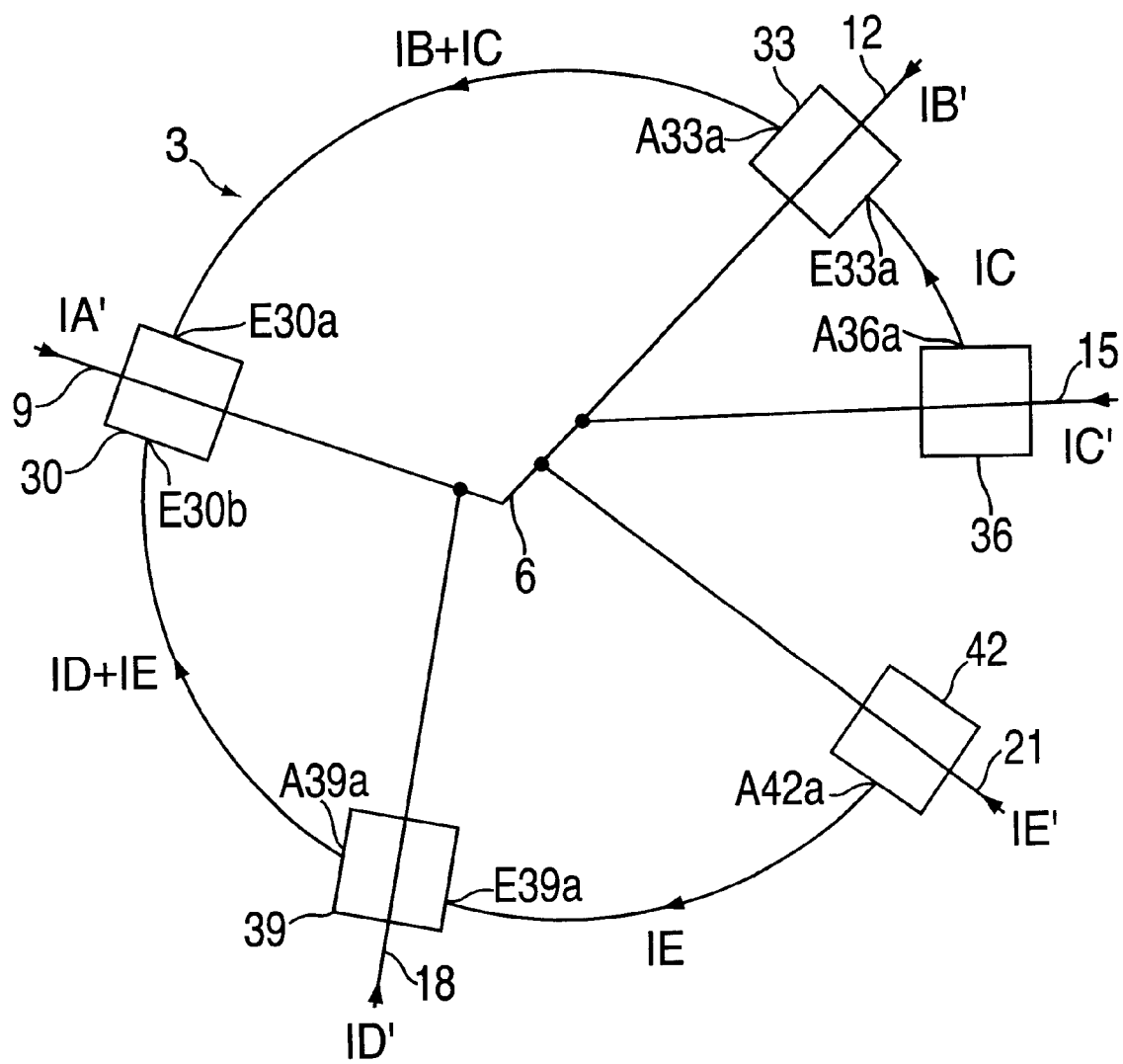
FIG. 1 shows an exemplary embodiment for an arrangement for the execution of the method according to the present invention.

FIG. 1 shows an arrangement 3 for monitoring an electrical conductor 6 for a fault current. Electrical conductor 6 has a total of five conductor ends, including a first conductor end 9, a second conductor end 12, a third conductor end 15, a fourth conductor end 18, and a fifth conductor end 21. A current measurement device is attached to each of conductor ends 9, 12, 15, 18, and 21, the current measurement devices being connected with one another via data lines, for example optical glass fibers. In this context, a selected first current measurement device 30 is connected to first conductor end 9 and additional current measurement devices 33, 36, 39, and 42 are connected respectively to the remaining conductor ends 12, 15, 18, and 21.

Specifically, first current measurement device 30 is connected with its measurement value input E30a to a measurement value output A33a of first additional current measurement device 33 (referred to in the following as second current measurement device 33 for short). Upstream from this current measurement device, the second of the additional current measurement devices 36 (referred to in the following as third current measurement device 36 for short) is connected, with its measurement value output A36a, at a measurement value input E33a.

Moreover, first current measurement device 30 is connected, with an additional measurement value input E30b, to a measurement value output A39a of the third of the additional current measurement devices 39 (referred to below as fourth current measurement device 39 for short). Upstream from this current measurement device, the fourth of the additional current measurement devices 42 (referred to in the following as fifth current measurement device 42 for short) is connected, with its measurement value output A42a, at a measurement value input E39a.

Five current measurement devices 30, 33, 36, 39, and 42 are thus connected to one another in a chain-type structure, third current measurement device 26 and fifth current measurement device 42 forming external current measurement devices in the chain, and first current measurement device 30, second current measurement device 33, and fourth current measurement device 39 forming internal current measurement devices in the chain.

Arrangement 3 is used to monitor electrical conductor 6 for a fault current in the manner described below.

Using a clock (pulse) generator (not shown), a clock signal is transmitted to all current measurement devices. This clock signal ensures that all current measurement devices determine the respective current in their conductor end at respectively identical points in time.

After all the current measurement devices have measured, at one point in time, currents IA', . . . , IE' in respective conductor ends 9, 12, 15, 18, 21, the following is carried out:

Current measurement value IC of third current measurement device 36, corresponding to current IC' in conductor end 15, is outputted at measurement value output A36a of third current measurement device 36, and is transmitted to measurement value input E33a of second current measurement device 33. Using an arithmetic unit (not shown in FIG. 1), this second current measurement device 33 adds current measurement value IC, transmitted from third current measurement device 36, to current measurement value IB, which corresponds to current IB' flowing through conductor end 12 of second current measurement device 33, forming a summation current measurement value IC+IB. This summation current measurement value IC+IB is transmitted to first current measurement device 30 from second current measurement device 33.

Fifth current measurement device 42 at fifth conductor end 21, as well as fourth current measurement device 39 at fourth conductor end 18, operate in exactly the same manner as the second and the third current measurement device, i.e., each adds, in sign-respecting fashion, the current measurement value of its own respective current measurement device to a current measurement value—present at its measurement value input—of the current measurement device that may respectively be arranged upstream, taking into account the respective direction of current, and outputs the resulting summation current measurement value at its measurement value output as a measurement value.

A measurement value composed of current measurement values IB and IC thus arrives at the one measurement value input E30a of first current measurement device 30, and an additional measurement value, composed of current measurement values IE and ID, arrives at additional measurement value input E30b of first current measurement device 30.

An overall current value is thereupon formed in first current measurement device 30 by addition of the one measurement value and the additional measurement value, as well as the current measurement value IA that indicates the current IA' in conductor end 9; this overall current value is equal to IA+IB+IC+ID+IE.

In accordance with the Kirchhoff laws, overall current value IA+IB+. . . +IE must be equal to 0 if no fault current has occurred; if the overall current value is not equal to 0, or if it exceeds a predetermined threshold value, a fault current has occurred. Here a fault current is understood to be a current flowing from conductor 6, or into conductor 6, at a fault point, for example a short-circuit point, and thus not at one of conductor ends 9, 12, 15, 18, or 21. Both types of fault current are reflected in the overall current value of current measurement device 30, which can be determined by comparison of the overall current value with the threshold value, which is approximately equal to 0.

To sum up, on the basis of the overall current value in selected first current measurement device 30 it is determined, by comparison with the threshold value, whether a fault current has occurred. In this context, for example in a direct-current system, it is possible not only to determine whether a fault has occurred at all, but in addition it is of course also possible to determine the type of the fault, if after the comparison of the overall current value with the predetermined threshold value with respect to absolute value the sign of the overall current value is also evaluated. This is because, according to its allocation to a direction of current, the sign indicates whether the fault current flowed into conductor 6 or out of conductor 6.

Figure 2:
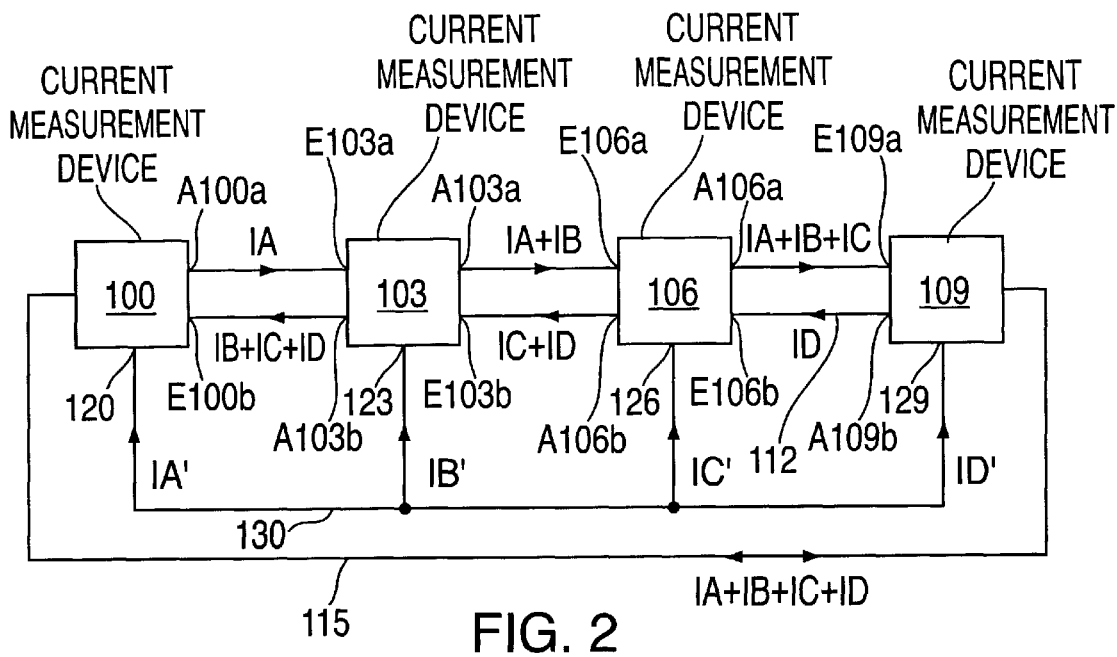
FIG. 2 shows an exemplary embodiment for an arrangement according to the present invention.

FIG. 2 shows an exemplary embodiment of an example arrangement according to the present invention. Current measurement devices 100, 103, 106, and 109 are connected to one another electrically by means of data lines 112 to form a chain-type structure. Here two current measurement devices—100 and 109—are located at the outer end of the chain, and two current measurement devices—103 and 106—are located in the interior of the chain.

First internal current measurement device 103 is connected, with its measurement value input E103*a*, to a measurement value output A100*a* of current measurement device 100, which is arranged upstream from device 103. A measurement value input E106*a* of second internal current measurement device 106 is arranged downstream from first internal current measurement device 103, at its measurement value output A103*a*, and a measurement value input E109*a* of second external current measurement device 109 is in turn connected downstream from second current measurement device 106, at its measurement value output A106*a*. Moreover, second external current measurement device 109 has a measurement value output A109*b* that is connected with an additional measurement value input E106*b* of second internal current measurement device 106; this second internal current measurement device 106 is moreover connected, with an additional measurement value output A106*b*, to an additional measurement value input E103*b* of first internal current measurement device 103. With an additional measurement value output A103*b*, this first internal current measurement device 103 is also connected with a measurement value input E100*b* of first external current measurement device 100.

Moreover, there is another data line 115—a duplex line between—first external current measurement device 100 and second external current measurement device 109.

In addition, each of current measurement devices 100, 103, 106, and 109 is respectively connected to a conductor end of electrical conductor 130 (shown only schematically in FIG. 2), which has four conductor ends 120, 123, 126, and 129, and measures current IA', IB', IC', or ID' flowing at its conductor end, with formation of current measurement values IA, IB, IC, or ID. In this context, first external current measurement device 100 measures current measurement value or values IA at first conductor end 120, first internal current measurement device 103 measures current measurement value or values IB at second conductor end 123, second internal current measurement device 106 measures current measurement value or values IC at third conductor end 126, and second external current measurement device 109 measures current measurement value or values ID at fourth conductor end 129.

The arrangement according to FIG. 2 is operated as follows: current measurement value IA, measured using first external current measurement device 100, is transmitted to the one measurement value input E103*a* of first internal current measurement device 103 via data line 112. In this data line, from its own current measurement value IB and from measurement value IA of first external current measurement device 100, a summation current measurement value IA+IB is formed that is transmitted, as measurement value IA+IB, to the one measurement value input E106*a* of second internal current measurement device 106. In second internal current measurement device 106, from measurement value IA+IB and its own current measurement value IC, a new summation current measurement value IA+IB+IC is formed that is transmitted as a measurement value to the one measurement value input E109*a* of second external current measurement device 109. In this current measurement device 109, from measurement value IA+IB+IC and from its own current measurement value ID, an overall current value IA+IB+IC+ID is formed; current measurement device 109 produces, at a control output that is not depicted, a fault signal S for a fault current if overall current value IA+IB+IC+ID is not equal to 0, or if it exceeds a predetermined threshold value.

Simultaneously, current measurement value ID of second external current measurement device 109 is transmitted, as an additional measurement value, to additional measurement value input E106*b* of second internal current measurement device 106. In second internal current measurement 106, the one measurement value IA+IB of first internal current measurement device 103 is now present at the one measurement value input E106*a*, and additional measurement value ID is now present at additional measurement value input E106*b*. From the two measurement values and from its own measured current measurement value IC, overall current value IA+IB+IC+ID is formed in current measurement device 106, and the fault signal is formed as soon as overall current value IA+IB+IC+ID is not equal to 0 or exceeds the predetermined threshold value; fault signal S is then outputted at a control output (not shown). Moreover, in current measurement device 106, an additional summation current measurement value IC+ID is formed from additional measurement value ID—present at additional measurement value input E106*b*—and its own current measurement value IC; the additional summation current measurement value IC+ID is outputted at additional measurement value output A106*b* and is transmitted to first internal current measurement device 103.

In first internal current measurement device 103, the one measurement value IA of first external current measurement device 100 is now present at the one measurement value input E103*a*, and additional measurement value IC+ID is now present at additional measurement value input E103*b*. From the two measurement values IA and IC+ID, and from its own measured current measurement value IB, overall current value IA+IB+IC+ID is formed in current measurement device 103, and the fault signal is formed as soon as overall current value IA+IB+IC+ID is not equal to 0 or exceeds the predetermined threshold value. Fault signal S is then outputted at a control output (not shown). Moreover, in current measurement device 103 an additional summation current measurement value IB+IC+ID is formed from additional measurement value IC+ID—present at additional measurement value input E103*b*—and its own current measurement value IB, and this additional summation current measurement value IB+IC+ID is outputted, at additional measurement value output A103*b*, to first external current measurement device 100.

In first external current measurement device 100, measurement value IB+IC+ID of first internal current measurement device 103 is now present at measurement value input E100*b*. In first external current measurement device 100, overall current value IA+IB+IC+ID is formed from measurement value IB+IC+ID and from its own measured current measurement value IA, and the fault signal is formed as soon as overall current value IA+IB+IC+ID is not equal to 0 or exceeds the predetermined threshold value; fault signal S is then outputted at a control output (not shown).

To sum up, one measurement value or two measurement values are thus transmitted to each of the current measurement devices, and with these values each of the current measurement devices is able, using its own current measurement value, to determine the overall current value and to produce the fault signal.

Via additional data line 115, the overall current value is transmitted between the two external current measurement devices 100 to and 109 for monitoring purposes; for this purpose, in the two current measurement devices it is checked whether the overall current value transmitted by the respective other external current measurement device corresponds to its own overall current value. If this is not the case, an alarm signal is produced indicating a fault in the measurement arrangement. A further advantage of additional data line 115 is that the arrangement according to FIG. 2 can also continue to be operated when data line 112 between two adjacent current measurement devices has been interrupted, since in such a case additional data line 115 can be used as a replacement for interrupted data line 112.

The one arithmetic unit and the additional arithmetic unit can for example be formed by a data processing installation or by a microprocessor arrangement.

Figure 3:
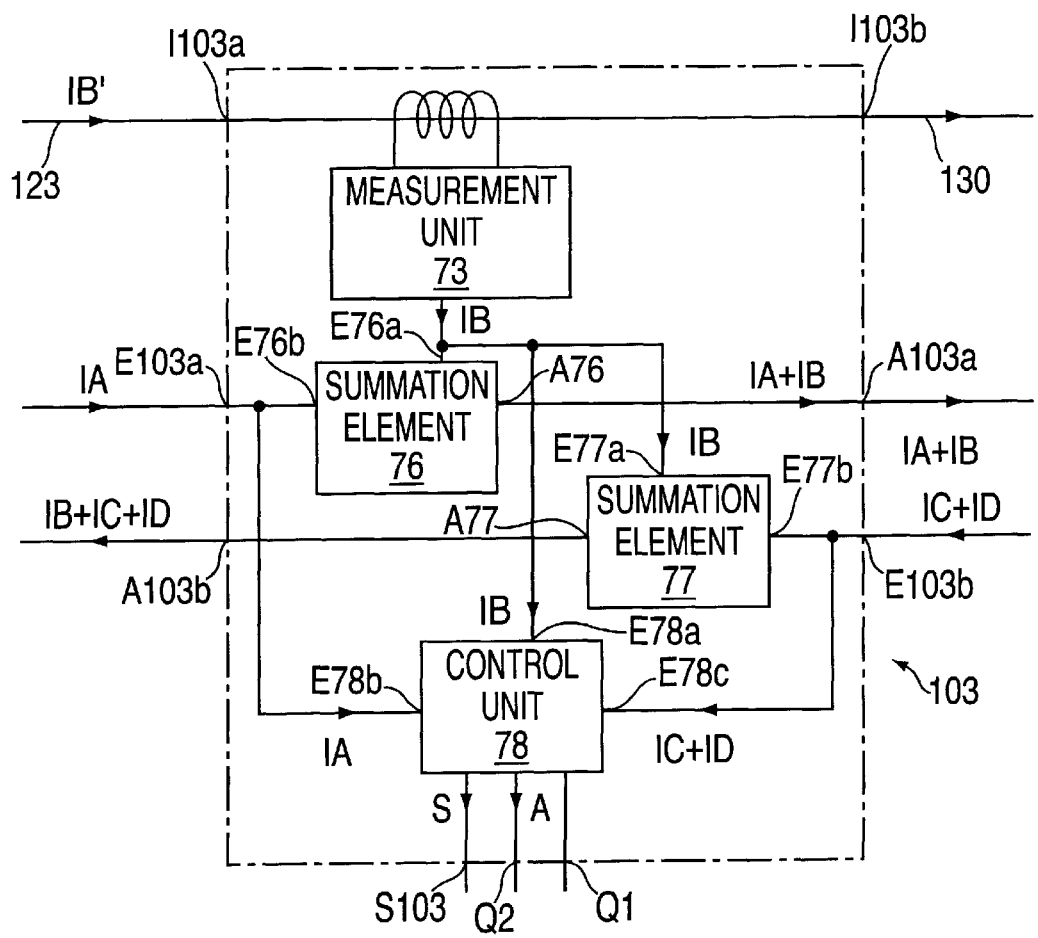
FIG. 3 shows an exemplary embodiment for a current measurement device according to the present invention having an arithmetic unit and a control unit.

FIG. 3 shows an exemplary embodiment of a current measurement device that can be used in the arrangements according to FIGS. 1 and 2. Here, for purposes of explanation the current measurement device 103 according to FIG. 2 is used as a basis, and, in order to facilitate understanding of FIG. 3, reference characters identical to those used in FIG. 2 are used for components in FIG. 3 that have already been explained in connection with FIG. 2.

Current measurement device 103 has a current input I103$a$ and an additional current input I103$b$, with which current measurement device 103 is connected to conductor end 123 of conductor 130 according to FIG. 2. A measurement unit 73 is connected with the two current inputs I103$a$ and I103$b$, and downstream from this measurement unit 73 there are arranged a summation element 76 as an arithmetic unit with an input E76$a$, an additional summation element 77 as an additional arithmetic unit with an input E77$a$, and a control unit 78 with an input E78$a$. Summation element 76 is connected, with an additional input E76$b$, with the one measurement value input E103$a$ of current measurement device 103, and is connected, with an output A76, with the one measurement value output A103$a$ of current measurement device 103. Additional summation element 77 is connected, with an additional input E77$b$, to additional measurement value input E103$b$ of current measurement device 103, and is connected, with an output A77, to additional measurement value output A103$b$ of current measurement device 103.

An additional input E78$b$ of control unit 78 is connected to the one measurement value input E103$a$ of current measurement device 103; an additional measurement value input E78$c$ of control unit 78 is connected with additional measurement value input E103$b$ of current measurement device 103.

Using measurement unit 73, current IB' in conductor end 123 is measured, and a current measurement value IB corresponding to current IB' is formed. This value arrives at arithmetic unit 76, in which a summation current measurement value IA+IB is formed from this value and from the one measurement value IA at the one measurement value input E103$a$, and this summation current measurement value is transmitted as a measurement value to the one measurement value output A103$a$ of current measurement device 103.

Current measurement value IB also arrives at additional summation element 77, in which an additional summation current measurement value IB+IC+ID is formed from additional measurement value IC+ID at additional measurement value input E103$b$ of current measurement device 103 and from current measurement value IB, and this additional summation current measurement value IB+IC+ID is outputted as a measurement value at the additional measurement value output A103$b$ of current measurement device 103.

Moreover, current measurement value IB is transmitted to control unit 78, in which an overall current value IA+IB+IC+ID is formed from its own current measurement value IB, the one measurement value IA, and additional measurement value IC+ID.

In control unit 78, this overall current value IA+. . . +ID is compared with a predetermined threshold value that is approximately equal to 0. If the overall current value exceeds the predetermined threshold value, a signal S is outputted at a control signal output S103 of current measurement device 103, indicating a fault current in conductor 130.

Moreover, current measurement device 103 has a terminal Q1 that is connected with control unit 78. If current measurement device 103 is to be operated as an external current measurement device 100 or 109 according to FIG. 2, the current measurement device can be connected via this terminal Q1 with the respective other external current measurement device via additional data line 115, for the transmission of overall current value IA+. . . +ID. In control unit 78, it is then compared whether its own overall current value is equal to the transmitted overall current value of the other external current measurement device. If this is not the case, an alarm signal A is outputted at an additional terminal Q2, indicating that a fault has occurred in the measurement arrangement.

The one and the other arithmetic unit 76 and 77, as well as control unit 78, can be formed by a data processing installation, for example a microprocessor arrangement.

What is claimed is:

1. A method for producing a fault signal that characterizes a fault current of an electrical conductor, the electrical conductor having at least three conductor ends, comprising:

providing current measurement devices so that a different one of the current measurement devices is coupled to a respective one of the conductor ends, the current measurement devices being connected together via data lines;

using the current measurement devices, measuring a current in each respective one of the conductor ends and forming current measurement values;

transmitting a measurement value to a selected one of the current measurement devices, the measurement value being formed from the current measurement values of other ones of the current measurement devices using sign-respecting addition;

using the selected one of the current measurement devices, forming an overall current value from the current measurement values of the selected one of the current measurement devices and the measurement value using sign-respecting addition; and producing the fault signal using the selected one of the current measurement devices if an absolute value of the overall current value exceeds a predetermined threshold value.

2. A method for producing a fault signal that characterizes a fault current of an electrical conductor, the electrical conductor having at least three conductor ends, comprising:

providing current measurement devices so that a different one of the current measurement devices is coupled to a respective one of the conductor ends, the current measurement devices being connected together via data lines;

using the current measurement devices, measuring a current in each respective one of the conductor ends and forming current measurement values;

transmitting a measurement value to a selected one of the current measurement devices, the measurement value being formed from the current measurement values of a first group of the others of the current measurement devices using sign-respecting addition;

transmitting an additional measurement value to the selected one of the current measurement devices, the additional measurement value being formed from the current measurement values of a second group of remaining ones of the current measurement devices by sign-respecting addition, the second group containing all current measurement devices except for the selected one of the current measurement devices and the current measurement devices of the first group;

using the selected one of the current measurement devices, forming an overall current value from the current measurement value of the selected current measurement device, the measurement value and the additional measurement value; and producing a fault signal using the selected one of the current measurement devices if an absolute value of the overall current value exceeds a predetermined threshold value.

3. An arrangement for producing a fault signal that characterizes a fault current of an electrical conductor having at least three conductor ends, comprising:

current measurement devices, a different one of the current measurement devices being coupled to a respective one of the conductor ends and measuring current in the respective one of the conductor ends to form a respective current measurement value, the current measurement devices being electrically connected to one another using data lines in a chain structure, the current measurement devices including internal current measurement devices and external current measurement devices, each of the internal current measurement devices has a respective measurement value input connected to a measurement value output of a respective upstream one of the current measurement devices, and has a respective measurement value output coupled to a measurement value input of a downstream one of the current measurement devices, a first one of the external current measurement devices has a measurement value output connected to a measurement value input of a downstream one of the internal current measurement devices, a second one of the external current measurement devices has a measurement value input connected to a measurement value output of an upstream one of the internal current measurement devices, each of the internal measurement devices includes an arithmetic unit that adds, in a sign-respecting fashion, a respective current measurement value to a measurement value, present at the respective measurement value input, of the respective upstream current measurement device, to form a summation current measurement value, and outputs the summation current measurement value as a measurement value at the respective measurement value output, and the second one of the external current measurement devices has a control unit that outputs the fault signal as soon as an overall current value, formed by sign-respecting addition of the respective measurement value of the upstream one of the internal current measurement devices and a respective current measurement value of the second one of the external current measurement devices, exceeds a predetermined threshold value.

4. The arrangement according to claim 3, wherein:

the internal current measurement devices are connected to one another so that an additional measurement value input of a first one of the internal current measurement devices is connected to an additional measurement value output of a downstream one of the internal current measurement devices, and an additional measurement value output of an additional measurement value output of a second one of the internal current measurement devices is connected to an additional measurement value input of an upstream one of the internal current measurement devices, the first one of the external current measurement devices is connected, via a measurement value input, to the additional measurement value output of a downstream one of the internal current measurement devices, the second one of the external current measurement devices is connected, via a measurement value output, to the additional measurement value input of an upstream one of the internal current measurement devices, each one of the internal measurement devices includes an arithmetic unit that adds, in a sign-respecting fashion, a respective current measurement value to an additional measurement value, present at the additional measurement value input of the one of the internal measurement devices of a downstream one of the current measurement devices to form an additional summation current measurement value, and outputs the additional summation current measurement value at an additional measurement value output of the one of the internal measurement devices as an additional measurement value, and at least one of the internal current measurement devices includes a control unit that produces the fault signal soon as an overall current value, formed by sign-respecting addition of measurement values present at the measurement value input and the additional measurement value input of the at least one of the internal current measurement devices and the measured current value of the at least one of the internal current measurement devices, exceeds the predetermined threshold value.

5. The arrangement according to claim 4, wherein:

the first external current measurement device includes a control unit that produces the fault signal as soon as an overall current value, formed by sign-respecting addition of measurement values present at the measurement value input of the first external current measurement device and the current measurement value of the first external current measurement device, exceeds the predetermined threshold value.

6. The arrangement according to claim 3, wherein the external current measurement devices are connected to one another via at least one additional data line via which the overall current value is transmitted.

7. A current measurement device for measuring a current in a conductor, comprising:
- at least one measurement value input;
- at least one measurement value output; and
- an arithmetic unit connected to the at least one measurement value input and the at least one measurement value output, the arithmetic unit adding a current measurement value corresponding to the current to a measurement value present at the at least one measurement value input to form a summation current measurement value, the arithmetic unit outputting the summation current measurement value at the at least one measurement value output.

8. The current measurement device according to claim 7, wherein the arithmetic unit includes a device with which a sign of the current measurement value can be changed.

9. The current measurement device according to claim 7, further comprising:
- a control unit connected to the arithmetic unit, the control unit outputting a signal for a fault current as soon as an overall current value, formed with the current measurement value and the measurement value exceeds a predetermined minimum.

\* \* \* \* \*